US005909078A

United States Patent [19]
Wood et al.

[11] Patent Number: 5,909,078
[45] Date of Patent: Jun. 1, 1999

[54] THERMAL ARCHED BEAM MICROELECTROMECHANICAL ACTUATORS

[75] Inventors: Robert L. Wood, Cary; Vijayakumar R. Dhuler, Raleigh, both of N.C.

[73] Assignee: MCNC, Research Triangle Park, N.C.

[21] Appl. No.: 08/767,192

[22] Filed: Dec. 16, 1996

[51] Int. Cl.$^6$ .............................. H02N 11/00; H01G 7/00; F01L 1/00
[52] U.S. Cl. ............................................ 310/307; 310/306
[58] Field of Search .................................. 310/309, 306, 310/307

[56] References Cited

U.S. PATENT DOCUMENTS

| | | | |
|---|---|---|---|
| 1,258,368 | 9/1918 | Smith | 310/307 |
| 1,658,669 | 2/1928 | Cohn et al. | 310/307 |
| 3,213,318 | 10/1965 | Glenn | 310/317 |
| 4,806,815 | 2/1989 | Honna | 310/307 |
| 5,184,269 | 2/1993 | Shimada et al. | 361/24 |
| 5,355,712 | 10/1994 | Petersen et al. | 73/4 R |
| 5,441,343 | 8/1995 | Pylkki et al. | 374/137 |
| 5,475,318 | 12/1995 | Marcus et al. | 324/762 |
| 5,558,304 | 9/1996 | Adams | 244/134 A |
| 5,600,174 | 2/1997 | Reay et al. | 257/467 |
| 5,629,665 | 5/1997 | Kaufmann et al. | 338/18 |
| 5,659,285 | 8/1997 | Takeda | 337/389 |

FOREIGN PATENT DOCUMENTS

| | | | |
|---|---|---|---|
| 764821 | 5/1934 | France | 310/306 |
| 792145 | 3/1958 | United Kingdom | 310/306 |

OTHER PUBLICATIONS

Klassen, et al., Silicon Fusion Bonding And Deep Reactive Ion Etching; A New Technology For Microstructures, *Transducers '95 –Eurosensos IX*, The 8th International Conference On Solid State Sensors And Actuators, and Eurosensors IX, Stockholm, Sweden, Jun. 25–29, 1995, pp. 556–559.

Noworolski, et al., Fabrication Of SOI Wafers With Buried Cavities Using Silicon Fusion Bonding And Electrochemical Etchback, *Transducers '95 –Eurosensors IX*, The 8th International Conference On Solid State Sensors And Actuators, and Eurosensors IX, Stockholm, Sweden, Jun. 25–29, 1995, pp. 71–74.

Single Crystal Silicon Actuators And Sensor Based On Silicon Fusion Bonding Technology, *Semi–Annual Progress Report 1, Advanced Research Projects Agency, Lucas NovaSensor*, Contract No. DAL 01–94–C–2411, Apr. –Jul. 1994.

Single Crystal Silicon Actuators And Sensors Based On Silicon Fusion Bonding Technology, *Semi–Annual Progress Report 2, Advanced Research Projects Agency, Lucas NovaSensor*, Contract No. DAL 01–94–C–3411, Jul., 1994 –Jan. 1995.

(List continued on next page.)

*Primary Examiner*—Thomas M. Dougherty
*Attorney, Agent, or Firm*—Bell Seltzer Intellectual Property Law Group of Alston & Bird LLP

[57] ABSTRACT

Microelectromechanical actuators include at least one arched beam which extends between spaced apart supports on a microelectronic substrate. The arched beams are arched in a predetermined direction and expand upon application of heat thereto. A coupler mechanically couples the plurality of arched beams between the spaced apart supports. Heat is applied to at least one of the arched beams to cause further arching as a result of thermal expansion thereof, and thereby cause displacement of the coupler along the predetermined direction. Internal heating of the arched beams by passing current through the arched beams may be used. External heating sources may also be used. The coupler may be attached to a capacitor plate to provide capacitive sensors such as flow sensors. The coupler may also be attached to a valve plate to provide microvalves. Compensating arched beams may be used to provide ambient temperature insensitivity.

29 Claims, 6 Drawing Sheets

OTHER PUBLICATIONS

Single Crystal Silicon Actuators And Sensors Based On Silicon Fusion Bonding Technology, *Semi–Annual Progress Report, Advanced Research Projects Agency, Lucas NovaSensor*, Contract No. DAL 01–94–C–3411, Jan. –Jul. 1995.

Single Crystal Silicon Actuators And Sensors Based On Silicon Fusion Bonding Technology, *Semi–Annual Progress Report, Advanced Research Projects Agency, Lucas NovaSensor*, Contract No. DAL 01–94–C–3411, Jan. –Aug. 1996.

Phipps, Thesis: "Design and Development of Microswitches for Micro–Electro–Mechanical Relay Matrices", Air Force Inst. of Tech., Wright–Patterson AFB, OH School of Engineering, 1995.

Yamagata et al., "a Micro Mobile Mechanism Using Thermal Expansion and Its Theoretical Analysis —A Comparison with Impact Drive Mechanism Using Piezoelectric Elements", Proceedings of the IEEE Micro Electro Mechanical Systems, 1994, pp. 142–147.

Oh et al., "Thin Film Heater on a Thermally Isolated Microstructure", Smart Materials Fabrication and Materials for Micro–Electro–Mechanical Systems, 1992, pp. 277–282.

W.H. Safranek, "The Properties of Electrodeposited Metals & Alloys", Amer. Electroplaters & Surface Finishers Society, 1986, pp. 295–315.

THERMAL ARCHED BEAM MICROELECTROMECHANICAL ACTUATORS

FIELD OF THE INVENTION

This invention relates to the field of electromechanical devices and more particularly to the field of microelectromechanical devices.

BACKGROUND OF THE INVENTION

Microelectromechanical systems (MEMS) have recently been developed as alternatives for conventional electromechanical devices such as relays, actuators, valves and sensors. MEMS devices are potentially low cost devices, due to the use of microelectronic fabrication techniques. New functionality may also be provided because MEMS devices can be much smaller than conventional electromechanical devices.

Many applications of MEMS technology use MEMS actuators. For example, many sensors, valves and positioners use actuators for movement. MEMS actuators can be designed using conventional MEMS processes, to provide actuators which can produce useful force and displacement, while consuming reasonable amounts of power. Many configurations of MEMS actuators have been proposed. For example, U.S. Pat. No. 5,475,318 to Marcus et al. entitled "Microprobe", discloses a cantilever bimorph microprobes and doubly supported beam bimorph microprobes. Other designs for MEMS actuators are described in a thesis by Phipps entitled *"Design And Development Of Micro Switches For Micro-Electro-Mechanical Relay Matrices"*, United States Air Force, June, 1995.

However, notwithstanding these efforts, there continues to be a need for MEMS actuators which can be fabricated using conventional microelectronic fabrication processes, and which are capable of producing useful forces and displacements while consuming reasonable amounts of power.

SUMMARY OF THE INVENTION

The present invention is a family of thermal arched beam microelectromechanical actuators. The thermal arched beam microelectromechanical actuators include an arched beam which extends between spaced apart supports on a microelectronic substrate. The arched beam expands upon application of heat thereto. Means are provided for applying heat to the arched beam to cause further arching of the beam as a result of thermal expansion thereof, to thereby cause displacement of the arched beam. Unexpectedly, when used as a microelectromechanical actuator, thermal expansion of the arched beam can create relatively large displacements and relatively large forces while consuming reasonable power.

In preferred embodiments, arched beam microelectromechanical actuators include a plurality of arched beams which extend between spaced apart supports on a microelectronic substrate. The arched beams are arched in a predetermined direction, preferably parallel to the substrate face. A coupler is used to mechanically couple the plurality of arched beams. Heat is applied to at least one of the arched beams to cause further arching of the at least one of the arched beams as a result of thermal expansion thereof, to thereby cause displacement of the coupler along the predetermined direction. By coupling multiple arched beams, stiffening of the mechanical structure may be provided and an increase in force may be provided. It will be understood, however, that all of the multiple arched beam aspects described herein may be applied to thermal arched beam actuators using a single arched beam, and vice versa.

According to the invention, many ways can be provided to heat the arched beams, including but not limited to internal current, external heat, fluid flow, ambient temperature, and radiation. In one embodiment, current is passed through each of the arched beams to cause further arching of the beams as a result of thermal expansion thereof. In other embodiments, current is passed through selected ones of the arched beams so that the selected ones of the arched beams are heated directly, while remaining arched beams are heated indirectly from the heated arched beams. In a preferred embodiment, alternating ones of the arched beams are heated directly and the remaining ones of the arched beams are heated indirectly. When current is passed through at least one of the arched beams, the at least one of the arched beams is preferably fabricated of a conductive material having high resistivity. For example, nickel-phosphorous (NiP) alloy may be used.

In other embodiments, a heater which is external to the arched beams is used to heat the ambient surrounding at least one arched beam and thereby heat the at least one arched beam. An external heater may be embodied as a resistor, such as a polysilicon resistor, which is fabricated on the microelectronic substrate, adjacent the at least one arched beam.

In other embodiments of the invention, external heating may be provided by fluid flow, such as liquid or gas flow, adjacent at least one arched beam. By coupling the thermal arched beam actuator to a fluid flow, a fluid sensor may be provided.

It will be understood that multiple heating means may be used to control arching of thermal arched beams. For example, both direct heating using current through at least one of the arched beams, and indirect heating using external resistive heaters may be used. The external heating may establish an initial displacement of the actuator, and the internal heating may be added to achieve fine motion control. In another example, external heating and internal heating may be combined with fluid flow heating.

Other aspects of the present invention add at least one compensating arched beam to the microelectromechanical actuator. The at least one compensating arched beam is arched in a second direction which is opposite the direction of the plurality of arched beams. The at least one compensating arched beam also expands upon application of heat thereto. The at least one compensating arched beam is also mechanically coupled to the coupler. The compensating arched beams preferably are thermally isolated from the heat applying means, but not from the overall ambient temperature. The compensating arched beams may compensate for ambient temperatures or other affects to allow for self-compensating actuators and sensors.

Other aspects of the present invention add at least one neutral beam which is not arched. The at least one neutral beam is also mechanically coupled to the coupler.

Thermal arched beams may be used to provide capacitive fluid flow sensors. A first capacitor plate is provided and a second capacitor plate is spaced apart from the first capacitor plate and is mechanically coupled to the coupler. Accordingly, further displacement of the plurality of arched beams causes displacement of the second capacitive plate.

The arched beams may be heated and may be exposed to fluid flow so that displacement of the plurality of arched beams is a function of the cooling effect of the fluid flow.

Displacement of the arched beams causes displacement of the coupler and the second capacitor plate which is coupled thereto. A capacitive microelectromechanical fluid flow sensor is thereby provided. Compensating arched beams may also be provided to reduce the sensitivity to ambient temperature changes.

Thermal arched beam microelectromechanical actuators may also be used to provide microelectromechanical valves also referred to herein as "microvalves". A valve body including a valve opening therein is provided, preferably by including an opening in the microelectronic substrate adjacent the microelectromechanical actuator. A valve plate is mechanically coupled to the coupler so that further displacement of the plurality of arched beams causes movement of the valve plate relative to the valve opening to thereby provide a microvalve.

In one embodiment, further displacement of the arched beams causes the valve plate to cover the valve opening to provide a "normally open" microvalve. In another embodiment, further displacement of the arched beams causes the valve plate to uncover the valve opening to thereby provide a "normally closed" microvalve.

In either embodiment, when the valve is closed, means may be provided for holding the valve plate against the valve opening to maintain the microvalve in a closed position. In particular, electrostatic force may be applied between the valve plate and the valve body adjacent the valve opening to thereby hold the valve plate against the valve opening. Microvalves according to the present invention may also include compensating arched beams which can render the valves less sensitive to temperature variations or other unwanted affects.

Thermal arched beam microelectromechanical actuators according to the invention can produce useful forces and displacements while consuming reasonable power. They can therefore be used to produce microelectromechanical systems having a wide variety of practical applications.

DETAILED DESCRIPTION OF PREFERRED EMBODIMENTS

Figure 1:
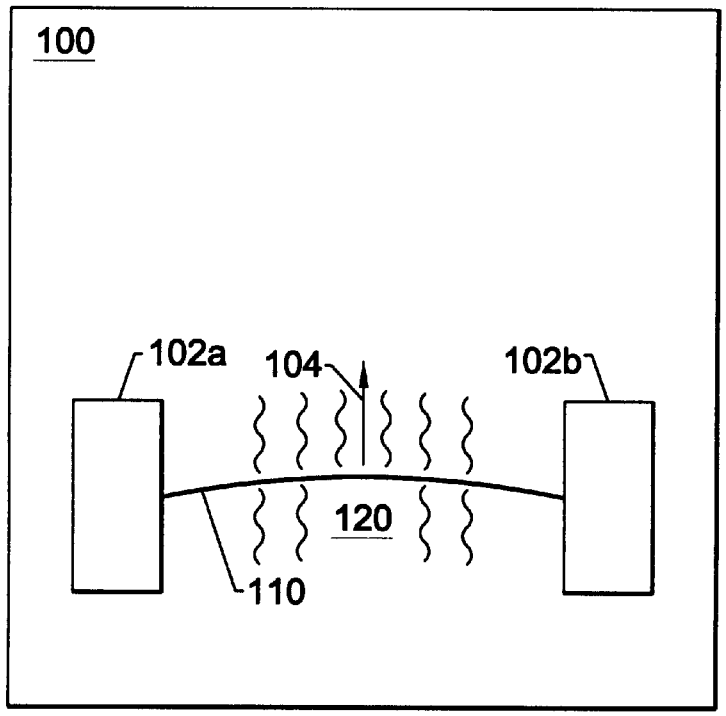
FIG. 1 is a top view illustrating a thermal arched beam microelectromechanical actuator according to the present invention, using a single thermal arched beam.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Referring now to FIG. 1, a first embodiment of a thermal arched beam microelectromechanical actuator according to the present invention is illustrated. As shown in FIG. 1, a microelectromechanical actuator according to the invention includes a microelectronic substrate 100 and spaced apart supports 102a and 102b on the microelectronic substrate. An arched beam 110 extends between the spaced apart supports 102a and 102b. The arched beam is fabricated of a metal or other conductor which has a positive coefficient of thermal expansion so that it expands upon application of heat thereto. As shown in FIG. 1, the arched beam is arched in a direction 104 which preferably extends parallel to the microelectronic substrate 100.

It will be understood by those having skill in the art that arched beam 110 may be fabricated using high aspect ratio electroplating techniques, which are commonly referred to as "LIGA" techniques, or other microelectronic techniques. Beam 110 may be freed from the microelectronic substrate using release layers and wet etching or other conventional techniques. As shown, the arched beam 110 is anchored at supports 102a and 102b such that it is arched toward the desired direction of motion 104.

Still referring to FIG. 1, the microelectromechanical actuator also comprises means 120 for applying heat to the arched beam. The applied heat causes further arching of the beam 110 as a result of thermal expansion thereof. The arching preferably occurs along the predetermined direction 104 and thereby causes displacement of the arched beam 110.

Many techniques can be used to apply heat to the thermal arched beam, according to the present invention. For example, current may be applied directly through the thermal arched beam 110. Alternatively, external heaters may be used. Fluid flow may also be used. Combinations of these and other heating techniques may also be used.

Figure 2:
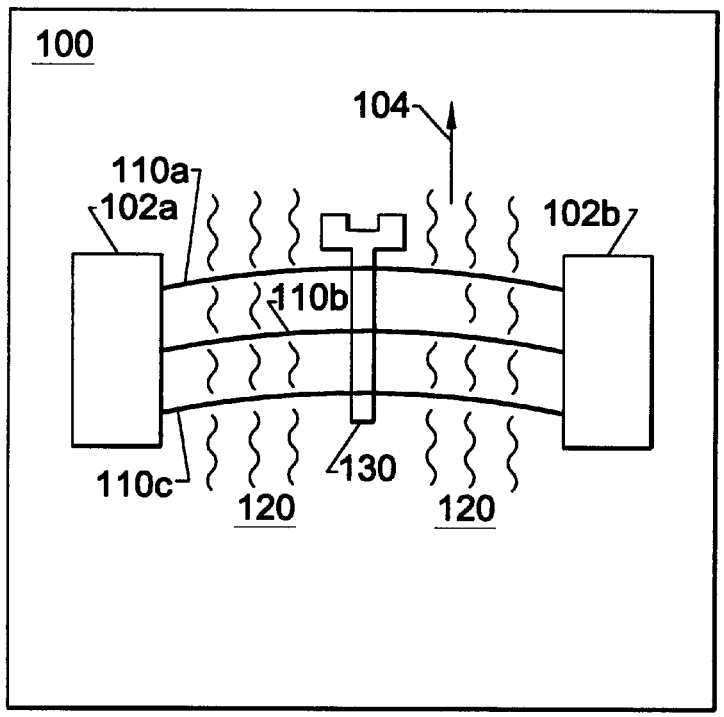
FIG. 2 is a top view illustrating a thermal arched beam microelectromechanical actuator according to the present invention, using multiple thermal arched beams.

Referring now to FIG. 2, another embodiment of microelectromechanical actuators according to the present invention is illustrated. In the embodiment of FIG. 2, a plurality of arched beams 110a–110c extend between the spaced apart supports 102a–102b and are arched in the predetermined direction 104. It will be understood by those having skill in the art that although only three beams 110a–110c are illustrated in FIG. 2, larger numbers of beams may also be used. It will also be understood that although all of the beams are shown as extending between a pair of supports 102a, 102b, each beam may include its own pair of supports or subgroups of beams may be attached to individual pairs of supports. Heating means 120 is provided for the multiple beams 110a–110c as already described.

Still referring to FIG. 2, a coupler 130 is also provided, which mechanically couples the plurality of arched beams 110a–110c between the spaced apart supports 102a, 102b. Accordingly, when heat is applied to at least one of the arched beams to cause further arching of the at least one of the arched beams as a result of thermal expansion thereof, displacement of the coupler 130 is provided along the predetermined direction 104. By configuring multiple arched beams in an array, force multiplication can be obtained, so that large force, and large displacement actuators may be provided. Moreover, by tying multiple beams together with coupler 130, a stiffening affect on the entire actuator may be provided to provide even higher degrees of force than would be available by multiples of individual arched beams.

Figure 3:
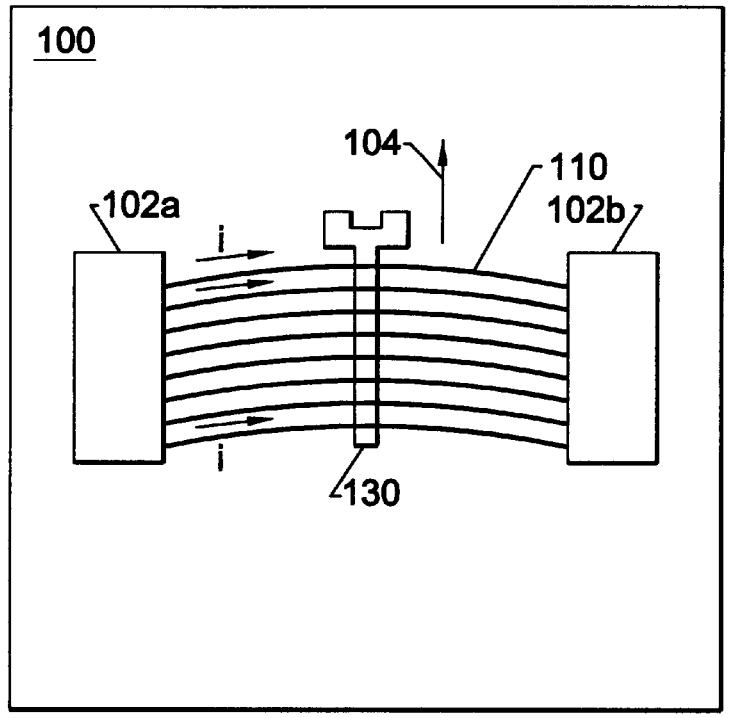
FIG. 3 is a top view of a thermal arched beam microelectromechanical actuator according to the present invention using internal resistive heating of the plurality of thermal arched beams.
Figure 4:
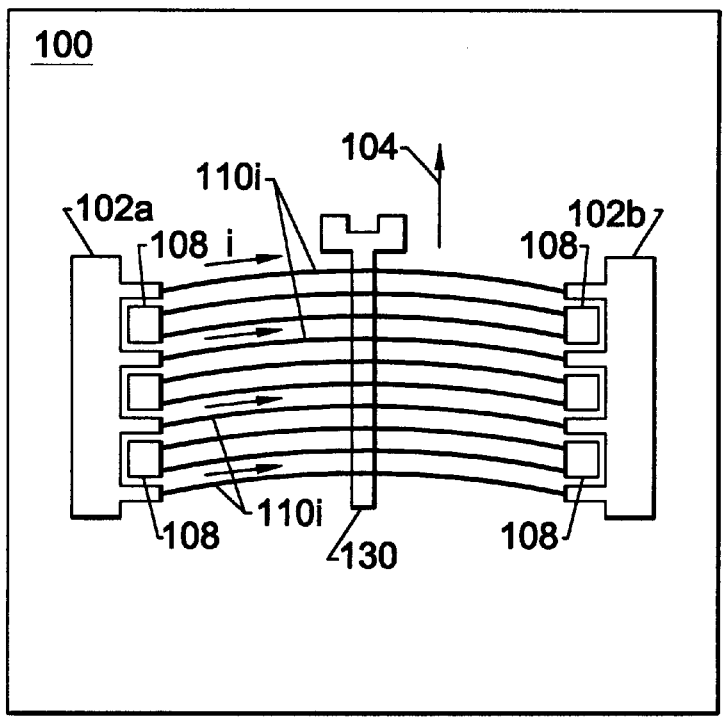
FIG. 4 is a top view of a thermal arched beam microelectromechanical actuator according to the present invention using internal resistive heating of every fourth thermal arched beam.

FIG. 3 is a top view of a microelectromechanical actuator wherein the heating means is provided by passing current i through the arched beams 110 to thereby cause further arching of the beams along the predetermined direction as a result of thermal expansion thereof. As shown in FIG. 3, each of the arched beams 110 is heated by passing current through the beam. In contrast, as shown in FIG. 4, alternating ones of the beams 110i pass current i therethrough to cause further arching of the alternating ones of the beams as a result of direct heating. The remaining ones of the beams are heated by indirect heating from the alternating ones of the arched beams 110i.

Accordingly, as shown in FIG. 4, the heated arched beams 110i are electrically connected to the supports 102a, 102b, but electrical insulators 108 are used to electrically insulate the remaining beams from the supports so that current does not pass through these beams. Other combinations of internally heated and externally heated beams may be used. It will also be understood that when internal heating of the beams is used, the same heating current need not be applied to each beam.

It will be understood by those having skill in the art that heating of the beams 110 is generally dependent upon the ohmic resistance of the beam. The ohmic resistance is generally determined by the cross-sectional area, the length of the beam and the resistivity thereof. In microelectromechanical actuators according to the present invention, the beams may be on the order of 5–10 $\mu$m in width so that significant heating occurs within the beam. This causes thermal expansion on the order of ten parts in $10^{-6}$/° C. of heating, depending upon the material. In a specific example, for nickel beams which are fabricated using the LIGA technique, this value is generally $13.3 \times 10^{-6}$/° C.

Thermal arched beam microelectromechanical actuators according to the present invention may produce a large amount of deflection for a given amount of thermal expansion. For example, a nickel beam which is 1 mm in length and which is heated by 20° C. will expand by only about 0.25 $\mu$m in length. This may be on the order of ten times less than required for most microelectromechanical actuator applications. In contrast, when the same beam is configured as a thermal arched beam, the same heating can cause 10 $\mu$m of lateral deflection at the tip of the arch, midway between the supports, assuming full compliance of the beam in the arched direction. Such deflection can be confined to the plane of the device by using high aspect ratio fabrication techniques such as LIGA.

When internal resistive heating of thermal arched beams is used, a large amount of current may be needed due to the low ohmic resistance of most metals including nickel. In order to overcome this potential problem, metallic alloys having high resistivity may be used. In a preferred embodiments nickel-phosphorous alloy may be used. Nickel-phosphorous alloy is compatible with the LIGA process. Inclusion of 10–15 atomic percent phosphorous may increase the resistance by a factor of ten over pure nickel. This can reduce the current demand by a factor of ten, into a range which is compatible with solid-state logic drivers.

Figure 5:
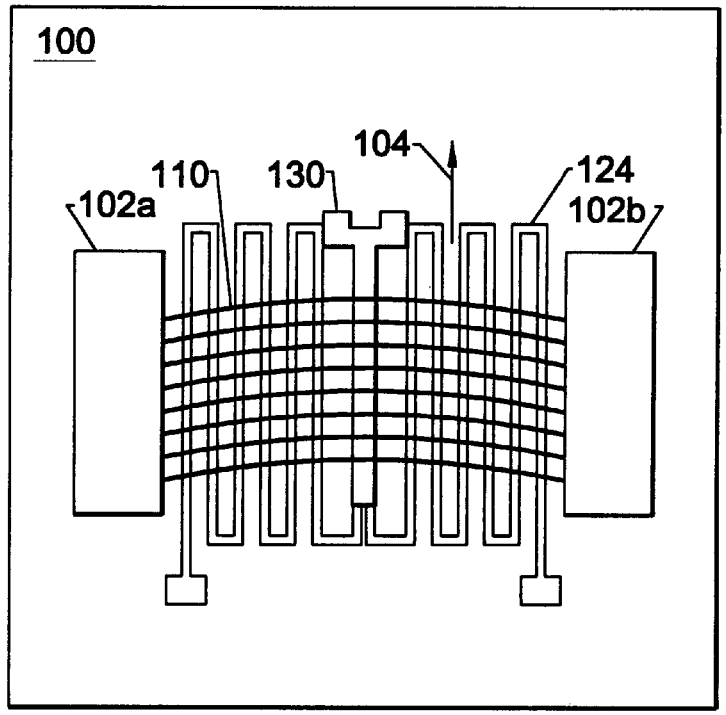
FIG. 5 is a top view of a thermal arched beam microelectromechanical actuator according to the present invention using external heating of the thermal arched beams.

Referring now to FIG. 5, an externally heated thermal arched beam microelectromechanical actuator is illustrated. As shown in FIG. 5, an external heater 124 such as a polycrystalline silicon (polysilicon) resistive heater, which may be fabricated on substrate 100 using conventional microelectronic techniques, is employed to heat the ambient surrounding the arched beam and thereby heat the arched beams. The fabrication of heaters on a substrate are well known to those having skill in the microelectronic and microelectromechanical arts and need not be described further herein.

It will also be understood that external heating and internal heating may be combined in a single thermal arched beam microelectromechanical actuator. Thus, for example, current may be passed through one or more of the thermal arched beams 110 of FIG. 5, in addition to external heating by external heater 124. Similarly, in the embodiments of FIGS. 3 and 4, an external heater 124 may be added. In embodiments which include internal ohmic heating and indirect external heating, the external heating may be used to establish an initial displacement. Internal heating can then be added to achieve fine motion control. Other uses of internal and external heating may be envisioned by those having skill in the art.

Thermal arched beam structures, such as the structure illustrated in FIG. 3, and which include five arched beams 110 of nickel which are 5 $\mu$m wide, 30 $\mu$m tall and 2 mm in length, can provide 30 $\mu$m deflection when 600 ma of current is passed between the two supports 102a, 102b. If nickel-phosphorous alloy is used, a ten-fold reduction in current may be expected.

Figure 6:
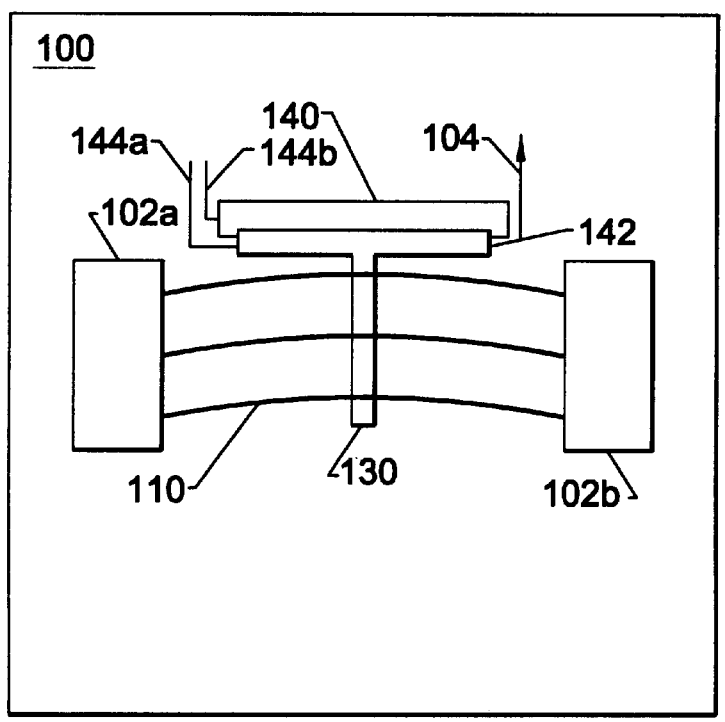
FIG. 6 is a top view of a first embodiment of a flow sensor using thermal arched beam microelectromechanical actuators according to the present invention.
Figure 7:
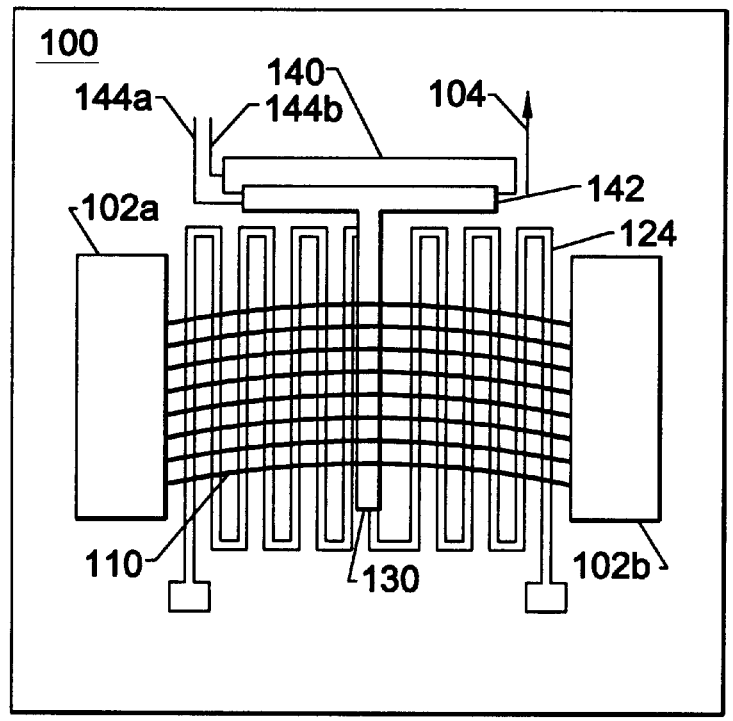
FIG. 7 is a top view of a second embodiment of a capacitive flow sensor using thermal arched beam microelectromechanical actuators according to the present invention.
Figure 8:
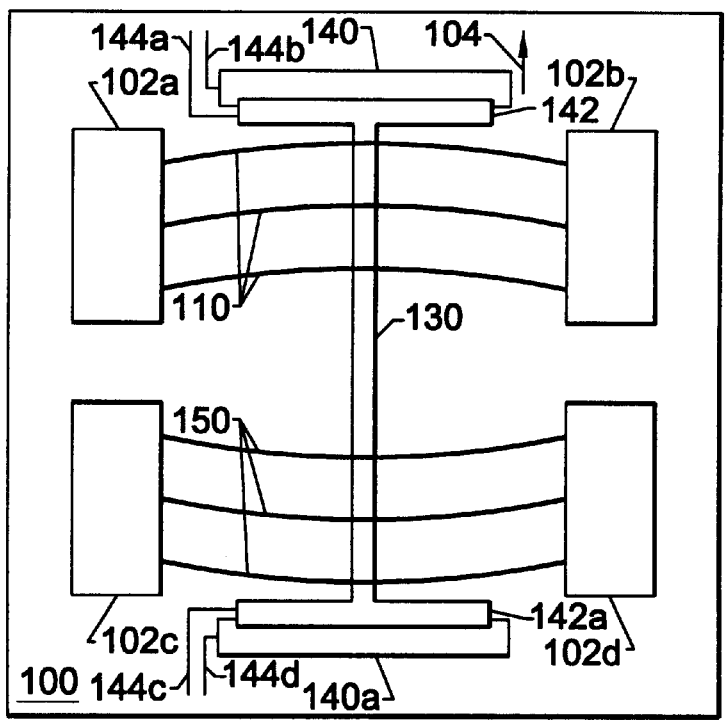
FIG. 8 is a top view of a third embodiment of a capacitive flow sensor using thermal arched beam microelectromechanical actuators according to the present invention, including compensating beams.

FIGS. 6–8 illustrate an application of thermal arched beam microelectromechanical actuators according to the present invention to provide fluid flow sensors. Fluid flow sensors, which measure flow of a gas or liquid stream, are widely used in many fields including automotive, biomedical, military, industrial and remote sensing applications. Miniaturization of flow sensors is important in applications where flow is determined in a small area. Examples of such applications are endotracheal tubes which are implanted in a patient to monitor pulmonary function, or inside an intake or exhaust manifold of an automobile engine.

Conventional solid-state flow sensors generally rely on indirect sensing using flow-induced cooling of a heated element. In general, a thermally isolated element is heated, either directly or indirectly, while electrically monitoring its temperature thermoresistively. When the element is exposed to the flowing fluid, cooling induced by fluid flow over the element determines an equilibrium temperature of the element. By reading this temperature, an indication of the flow is provided. For example, the lower the temperature, the higher the flow rate. Alternatively, temperature can be maintained constant in the element while the flow takes place, and the power which is necessary to maintain constant temperature can provide a measurement of the flow.

Unfortunately, conventional solid-state flow sensors may be sensitive to the ambient temperature of a fluid they are measuring. They may also have poor sensitivity to low flow conditions due to limited thermoresistive or pyroelectric properties of conventional materials. Complex temperature compensation systems may be necessary to compensate for ambient temperature sensitivity.

FIGS. 6, 7 and 8 illustrate embodiments of thermal arched beam microelectromechanical actuators which can provide high performance flow sensors. Referring now to FIG. 6, a thermal arched beam flow sensor includes a first capacitor plate 140, and a second capacitor plate 142 which is spaced apart from the first capacitor plate 140, and which is mechanically coupled to the coupler 130. Further displacement of the plurality of arched beams 110 causes displacement of the second capacitor plate 142 in the direction of arrow 104 to thereby vary the capacitance. A pair of terminals 144a, 144b may be used to sense the capacitance between the plates 140 and 142. At least one of the arched beams is exposed to a fluid flow to thereby provide a capacitive flow sensor. Preferably, the arched beams are thermally isolated so that they are sensitive to the convective cooling rate and thus to flow conditions in the vicinity of the device.

As described above, in order to operate the structure of FIG. 6, as a flow sensor, the beams 110 generally should be thermally isolated from the substrate 100. This may be accomplished by etching the substrate anisotropically using KOH or similar etchants. Alternatively, the thermal arched beam microelectromechanical actuator can be fabricated on a thin diaphragm using conventional micromachining techniques. Other thermal isolation techniques are well known in the microelectronic and MEMS fabrication arts. Once isolated from the substrate 100, the thermal arched beams 110 cool primarily via heat loss to the immediate environment, and are thus sensitive to local flow.

In order to operate the flow sensor of FIG. 6, the beams may be heated to drive plate 142 into overlap with plate 140. This can be done by direct ohmic heating of the beams or by indirect heating using external heater 124 as shown in FIG. 7. Heating may be performed in alternating current or direct current mode.

Cooling of the beams 110 causes plate 142 to move away from plate 140 thereby reducing the overlap and thereby reducing the capacitive coupling between the plates. Alternatively, plates 140 and 146 can be arranged so that cooling causes an increase in overlap and an increase in capacitance. Accordingly, the exact capacitance may depend upon the balance between the rate of heating and the rate of cooling. External capacitance sensing circuitry may be used to determine the separation of plates 140 and 142 via terminals 144a and 144b, and thereby measure the temperature of the beams. Since the capacitance varies with cooling rate, the capacitance can be calibrated to provide quantitative indication of the flow rate.

A general comparison of the sensitivity of a thermal arched beam capacitive sensor with a conventional thermoresistive sensor may be obtained by considering the magnitude of change in properties of each device as a function of temperature. The sensitivity of thermal resistive materials is generally determined by the thermal coefficient of resistance. In conventional materials this on the order of 0.001–0.003/° K. Thus, for example, a polysilicon resistor with a resistance of 5,000 Ω will provide a temperature sensitivity of about 5 Ω/° K. This corresponds to a voltage output sensitivity of about 0.025%/° K. In contrast, with a thermal arched beam capacitor, the capacitance generally varies linearly with temperature, and the specific configuration of the capacitor and its thermomechanical response to temperature generally determines its sensitivity. It is expected that thermal arched beam capacitive sensors can be fabricated having sensitivities of about 1 pF/° K. If an alternating current signal is used to sense this capacitive change, an output sensitivity of about 17%/° K may be obtained. Accordingly, a thermal arched beam flow sensor should be able to provide superior sensitivity for all flow ranges, and especially high sensitivity in the low-flow measurement regime.

FIG. 8 illustrates a thermal arched beam flow sensor which is internally compensated for varying ambient temperature. As shown in FIG. 8, at least one compensating arched beam 150 is added. The at least one compensating arched beam 150 is arched in a second direction which is opposite the predetermined direction 104. The at least one compensating arched beam 150 expands upon application of heat thereto and is mechanically coupled to the coupler 130.

The compensating beams 150 are preferably not exposed to the fluid flow but are exposed to the ambient temperature of the sensor. In other words, the thermal arched beams 110 are exposed to the fluid flow but the compensating beams 150 are isolated from the fluid flow. Thus, the compensating beams maintain a constant equilibrium position of the overall structure over a wide temperature range. The flow sensing side of the device 110 is thereby rendered insensitive to fluctuations in ambient temperature. A second pair of capacitive plates 140a, 142a and a second pair of terminals 144c and 144d may also be provided to enhance the signal-to-noise ratio.

It will be understood that in order to isolate the compensating beams from the fluid flow, a relatively large spacing may need to be maintained between the heated thermal arched beams 110 and the compensating beams 140. Thus, two pair of spaced apart supports 102a, 102b, 102c, and 102d may be provided, and they may be separated by a relatively large distance or otherwise isolated from the fluid flow. In contrast with conventional flow sensors which may require extra sensing and compensation circuitry to allow for fluctuations in ambient temperature, the embodiment of FIG. 8 may provide self-compensation for ambient temperature variations.

It will also be understood that the flow sensors of FIGS. 6–8 may be modified for specific flow sensing applications. Optimization of the flow sensors for a specific flow regime and/or temperature range may be provided by varying the sizes and number of arched beams, the structure and size of the capacitor, and other parameters. In other words, the mechanical design may be varied to determine the performance of the device. In contrast, in conventional thermoresistive devices, the material properties may primarily govern performance, and may be more difficult to modify.

In one exemplary embodiment of the present invention, 30 μm thick electroplated nickel thermal arched beams may be formed and isolated from a silicon wafer substrate by etching the underlying silicon wafer substrate to a depth of 60 μm. Heating of the beams may be accomplished by passing current through the beams at frequencies ranging from direct current to several hundred hertz or more. A flow rate of nitrogen is applied over the actuator which causes the actuator equilibrium position to shift in proportion to the flow rate. The shift may be on the order of 10 µm, thus providing a sensitivity of about 1 pF/° K.

Figure 9:
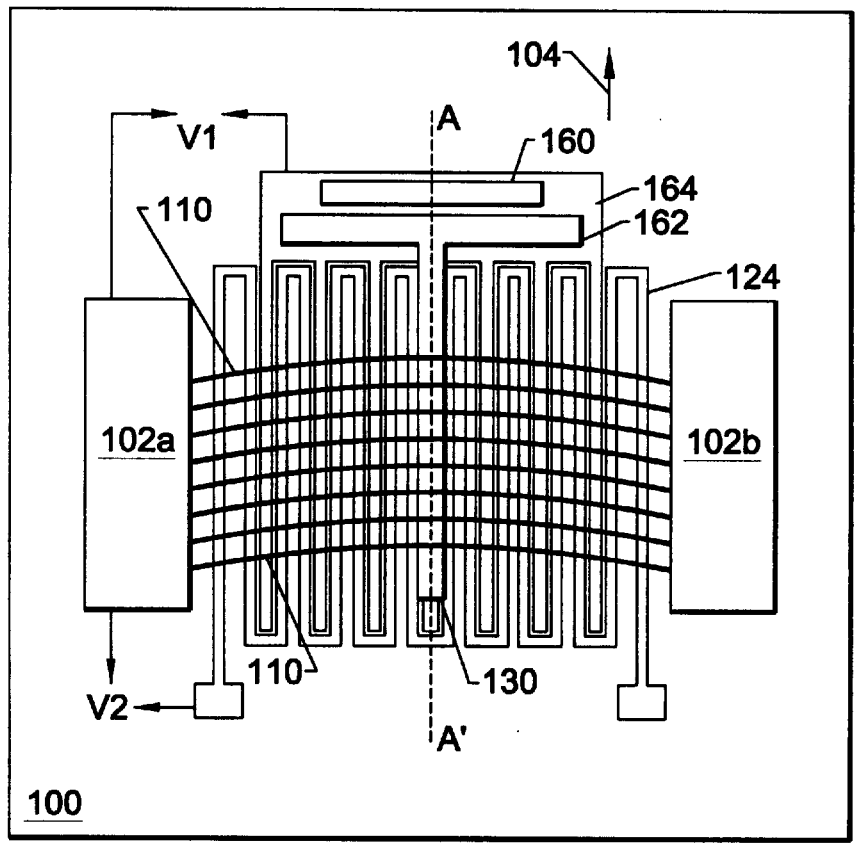
FIG. 9 is a top view of a microvalve which uses thermal arched beam micromechanical actuators according to the present invention.

Referring now to FIG. 9, a microvalve using thermal arched beam microelectromechanical actuators according to the present invention is shown. As shown in FIG. 9, the microvalve includes a microvalve body which may be formed in the substrate 100 including a valve opening 160 therein. A valve plate 162 is mechanically coupled to the coupler 130, so that further displacement of the arched beams 110 causes movement of the valve plate 162 relative to the valve opening 160.

As also shown in FIG. 9, means for holding the valve plate against the valve opening to maintain the microvalve in a closed position, is also provided. In particular, a buried electrode 164 may be provided around the valve opening 160. By applying a pull-down voltage V1 between buried electrode 164 and supports 102a, 102b, an electrostatic force is generated between valve plate 162 and the valve body adjacent the opening 160 to thereby hold the valve plate 162 against the valve opening 160.

Figure 10A:
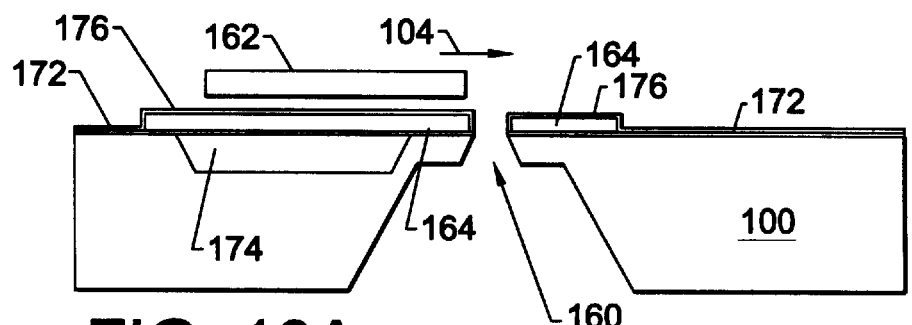
FIGS. 10A and 10B are side cross-sectional views of the microvalve of FIG. 9 in open and closed positions, respectively.
Figure 10B:
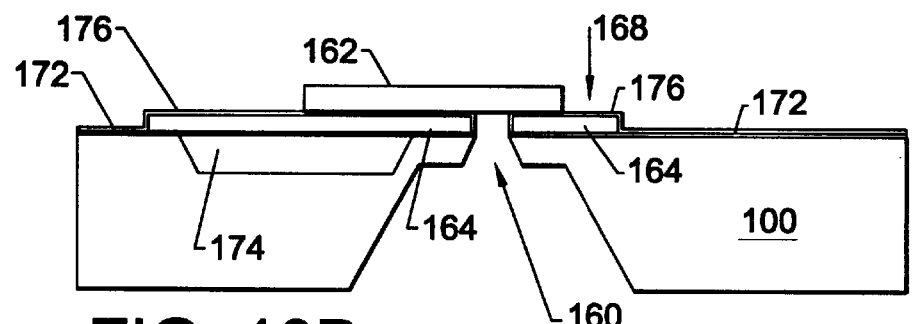

Still referring to FIG. 9, valve plate 162 is actuated by the thermal arched beams 110 to cover the valve opening 160, either partially or entirely, thus regulating flow through the opening 160. FIGS. 10A and 10B illustrate cross-sectional views of the thermal arched beam microvalve of FIG. 9 in an open position and closed position respectively. As shown in FIGS. 10A and 10B, the valve opening may be defined in substrate 100, which may be a silicon substrate, using bulk silicon micromachining or other conventional processes.

When plate 162 is actuated in the direction shown by arrow 104 in FIGS. 9 and 10A, a pull-down force in the direction of arrow 168 may be produced by applying pull-down voltage V1 between the plate 162 and the buried electrode layer 164 in the valve substrate. The voltage V1 is sufficient to provide electrostatic clamping of the plates to the substrate. Preferably, the gap between the plate 162 and the buried electrode 164 is sufficiently small, on the order of 1,000–3,000 Å, so that only a few tens of volts may be necessary to clamp the plate to the substrate in the direction of arrow 168 and thereby seal the valve opening.

In order to return the valve to its original (open) state, removal of clamping voltage V1 returns the plate to its original position under spring tension of the thermal arched beams. It will also be understood that the holding means may be provided by the fluid pressure itself which can maintain the valve in its closed position.

The microvalve may be actuated by heating the beams 110 with a resistor 124 which is patterned beneath the arched beams. The resistor can be made from polysilicon patterned on a sacrificial layer or diaphragm 172 to provide thermal isolation from the substrate 100. As already described, the beams may also be heated by passing current through the beams. In this case, thermal isolation may also be provided by etching a recess 174 directly in the substrate 100 beneath the arched beams 110.

The thermal arched beam structure is preferably fabricated with electroplated nickel or similar material using high aspect ratio with lithographic processes. Since nickel may be deposited with internal tensile stress, a high stiffness to out of plane deflection may be provided. Electroplating of nickel layers with internal stress is described in "The Properties of Electrodeposited Metals and Alloys," H. W. Sapraner, American Electroplaters and Surface Technology Society, 1986, pp. 295–315, the disclosure of which is hereby incorporated herein by reference.

Still referring to FIGS. 9 and 10A–10B, the thermal arched beams 110 and the support 102 are preferably conductive so as to respond to clamping voltage V1. The buried electrode layer 164 may be fabricated concurrently with the polysilicon heater 124, and is insulated on top by an electrically isolating film 176 which may be silicon nitride, silicon dioxide, or other conventional insulating films. All of the above described structures can be fabricated using conventional MEMS processing techniques.

If additional pull-down voltage is desired, a second pull-down voltage V2 may be applied between the thermal arched beams 110 and the polysilicon heater 124. The additional pull-down voltage V2 can also move the thermal arched beams out of plane towards the substrate 100.

It will be understood that the structure of FIGS. 9 and 10A–10B provide a "normally open" valve configuration. In other words, activation of the valve shuts off the fluid flow. A "normally closed" configuration can also be provided, wherein activation of the valve opens the fluid flow. A normally closed configuration may be provided by coupling two actuators of FIG. 9 together with a latch mechanism so that upon latching, the plate 162 is latched over the flow channel, sealing it. Activation of the valve can cause the plate to move away from the flow channel and open the valve. Friction should not be a problem since large amounts of force, on the order of one to several mN depending upon the construction of thermal arched beam actuator, are available for sliding the valve gate.

Microvalves as described herein can provide several advantages over conventional MEMS valves. In particular, the degree to which the valve is open or closed can be accurately established by the thermal arched beam actuator. Accordingly, precise proportional control of flow rate may be obtained. In contrast, conventional valves generally use a diaphragm closure that undergoes a large change in flow for a small change in diaphragm position, thereby making it more difficult to achieve proportional control.

Thermal arched beam microvalves may only consume power during opening or closing. The electrostatic clamping which is used to hold the valve in position generally will draw little or no current. Accordingly, current may only be drawn when the valve is actuated. In contrast, conventional thermally actuated valves, including thermally actuated MEMS valves, generally continuously draw power when activated. Thus, power must generally be supplied continuously, and continuously dissipated.

Thermal arched beam microvalves of FIG. 9 can also provide built in mechanical compensation. Thermally actuated valves are generally sensitive to temperature and may therefore be limited to operating in a specific temperature range. For example, a diaphragm type valve which is actuated via a heated bimetallic actuator will generally open by simple ambient heating. However, when a thermal arched beam valve is used, an unheated thermal arched beam actuator can be linked in an opposing fashion with a heated one to provide neutral thermal response, as was already described in connection with FIG. 8. Thus, a wide variety of operational temperatures may be used with thermal arched beam microvalves.

In conventional MEMS valves, the diaphragm or other flow gating element may also be heated directly to actuate it. This can undesirably heat the fluid stream due to its close proximity to the flow opening. In contrast, in thermal arched beam valves, the actuator can be physically distanced from the flow orifice 160. Moreover, since thermal arched beam valves need only be intermittently activated, total heat loading may be lower.

Finally, thermal arched beam microvalves may be fabricated efficiently. Conventional MEMS valves generally require precision assembly of several microstructural elements to form the active and passive components of the valve. In contrast, thermally arched beam valves may be fabricated with batch processing. This can make thermally arched beam valves less costly and more reliable than conventional designs.

Figure 11:
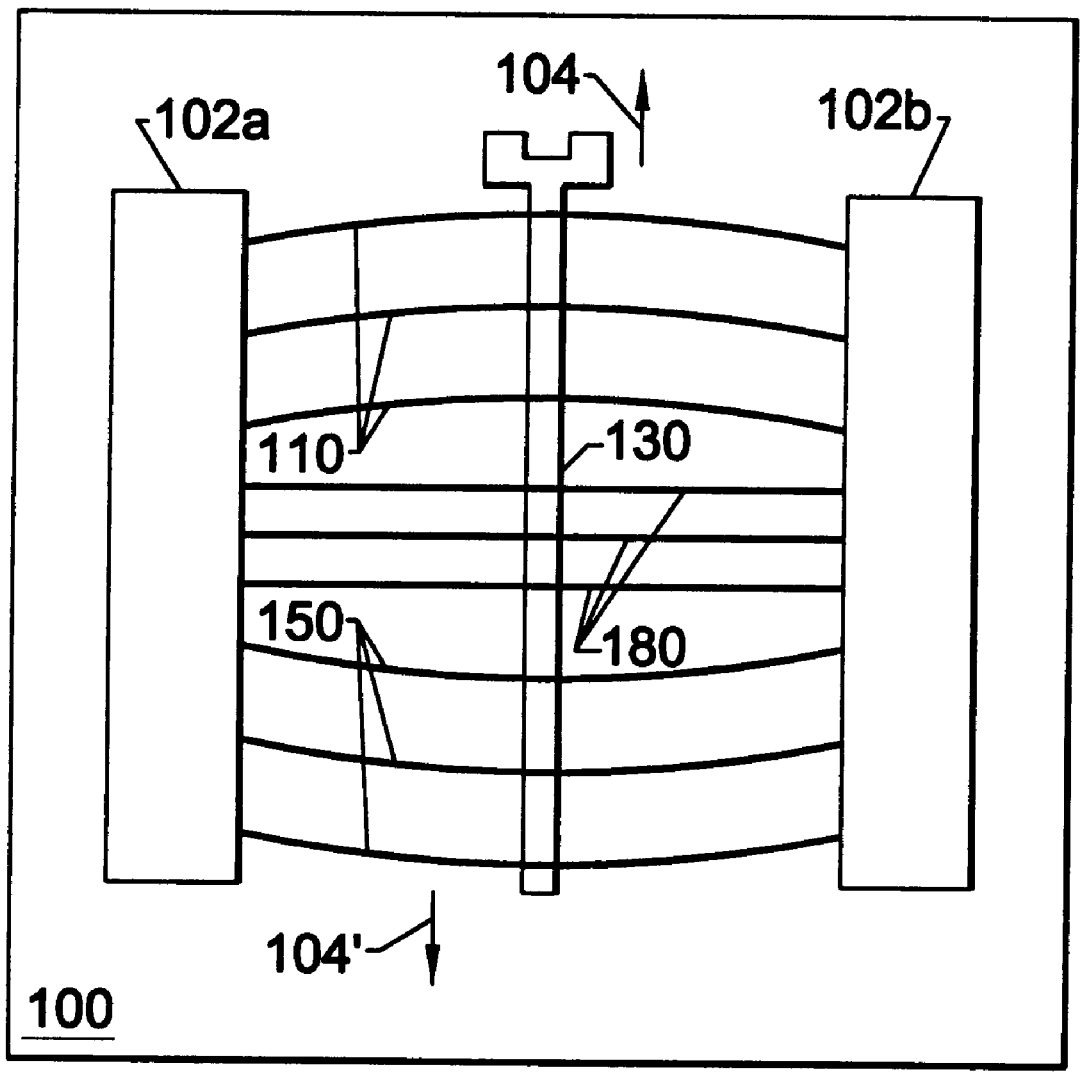
FIG. 11 is a top view of a thermal arched beam microelectromechanical actuator according to the present invention, including compensating beams and neutral beams.

Referring now to FIG. 11, another embodiment of a thermal arched beam microelectromechanical actuator according to the present invention is shown. As shown in FIG. 11, the microelectromechanical actuator includes a plurality of thermal arched beams 110 and a plurality of compensating thermal arched beams 150, as was already described. The actuator also includes at least one neutral beam 180 which is not arched and which is mechanically coupled to the coupler 130. Accordingly, a bidirectional actuator may be provided which can provide actuation in direction 104 and in the opposite direction 104'.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A microelectromechanical structure comprising:
a microelectronic substrate defining a reference plane;
spaced apart supports on the microelectronic substrate;
an arched beam which extends between the spaced apart supports and which expands upon application of heat thereto for movement parallel to the reference plane defined by said microelectronic substrate, said arched beam being formed of a single material; and
a heater disposed on the microelectronic substrate so as to underlie said arched beam and to be spaced apart from said arched beam, said heater adapted to heat the ambient surrounding the arched beam which, in turn, heats the arched beam to cause further arching of the beam as a result of thermal expansion thereof, to thereby cause displacement of the arched beam parallel to the reference plane defined by said microelectronic substrate.

2. A microelectromechanical structure according to claim 1 wherein the arched beam is arched in a predetermined direction which extends parallel to the microelectronic substrate, and wherein the heat supplied by said heater causes further arching of the beam along the predetermined direction as a result of thermal expansion thereof, to thereby cause displacement of the arched beam along the predetermined direction.

3. A microelectromechanical structure comprising:
a microelectronic substrate;
spaced apart supports on the microelectronic substrate;
an arched beam which extends between the spaced apart supports and which expands upon application of heat thereto;
means for applying heat to the arched beam to cause further arching of the beam as a result of thermal expansion thereof, to thereby cause displacement of the arched beam;

a first capacitor plate; and
a second capacitor plate which is spaced apart from the first capacitor plate and which is mechanically coupled to the arched beam, such that further displacement of the arched beam causes displacement of the second capacitor plate.

4. A microelectromechanical structure according to claim 3 wherein the means for applying heat to the arched beam comprises means for passing current through the arched beam to cause further arching of the beam as a result of thermal expansion thereof.

5. A microelectromechanical structure according to claim 4 wherein the arched beam is fabricated of a conductive material having high resistivity.

6. A microelectromechanical structure according to claim 5 wherein the arched beam is fabricated of nickel-phosphorous alloy.

7. A microelectromechanical structure according to claim 3 wherein the means for applying heat to the arched beam comprises a heater which is external to the arched beam, which heats the ambient surrounding the arched beam and thereby heats the arched beam to cause further arching of the beam as a result of thermal expansion thereof.

8. A microelectromechanical structure according to claim 3 wherein the means for applying heat comprises means for exposing the arched beam to a fluid flow to thereby provide a capacitive flow sensor.

9. A microelectromechanical structure comprising:
a microelectronic substrate;
spaced apart supports on the microelectronic substrate;
an arched beam which extends between the spaced apart supports and which expands upon application of heat thereto;
means for applying heat to the arched beam to cause further arching of the beam as a result of thermal expansion thereof, to thereby cause displacement of the arched beam;
a valve body including a valve opening therein; and
a valve plate which is mechanically coupled to the arched beam, such that displacement of the beam causes movement of the valve plate relative to the valve opening, to thereby provide a microvalve.

10. A microelectromechanical structure according to claim 9 further comprising:
means for holding the valve plate against the valve opening to maintain the microvalve in a closed position.

11. A microelectromechanical structure according to claim 10 wherein the holding means comprises means for applying electrostatic force between the valve plate and the valve body adjacent the valve opening to thereby hold the valve plate against the valve opening.

12. A microelectromechanical structure according to claim 9 wherein said microelectronic substrate comprises said valve plate and defines the valve opening.

13. A microelectromechanical structure comprising:
a microelectronic substrate;
spaced apart supports on the microelectronic substrate;
a plurality of arched beams which extend in parallel between the spaced apart supports, which are arched in a predetermined direction, and which expand upon application of heat thereto;
a coupler which mechanically couples the plurality of arched beams between the spaced apart supports; and
a heater disposed on the microelectronic substrate so as to underlie said plurality of arched beams and to be spaced apart from said plurality of arched beams, said heater adapted to heat the ambient surrounding at least one of the arched beams which, in turn, heats the at least one of the arched beams to cause further arching of the at least one arched beams as a result of thermal expansion thereof, to thereby cause displacement of the coupler along the predetermined direction.

14. A microelectromechanical structure according to claim 13 further comprising:

at least one compensating arched beam which is arched in a second direction which is opposite the predetermined direction, which expands upon application of heat thereto, and which is mechanically coupled to the coupler.

15. A microelectromechanical structure according to claim 13 further comprising:

a valve body including a valve opening therein; and a valve plate which is mechanically coupled to the coupler, such that further displacement of the plurality of arched beams causes movement of the valve plate relative to the valve opening, to thereby provide a microvalve.

16. A microelectromechanical structure according to claim 15 further comprising:

means for holding the valve plate against the valve opening to maintain the microvalve in a closed position.

17. A microelectromechanical structure according to claim 16 wherein the holding means comprises means for applying electrostatic force between the valve plate and the valve body adjacent the valve opening, to thereby hold the valve plate against the valve opening.

18. A microelectromechanical structure according to claim 13 further comprising:

means for thermally isolating the plurality of arched beams from the microelectronic substrate.

19. A microelectromechanical structure comprising:

a microelectronic substrate;

spaced apart supports on the microelectronic substrate;

at least one arched beam which extends between opposed end portions that are attached to respective ones of the spaced apart supports, which is arched in a predetermined direction, and which expands upon application of heat thereto so as to further arch in the predetermined direction;

at least one compensating arched beam which extends between opposed end portions that are attached to respective ones of the spaced apart supports, said at least one compensating arched beam being arched in a second direction which is opposite the predetermined direction such that a concave surface of said at least one arched beam faces a concave surface of said at least one compensating arched beam, said at least one compensating arched beam adapted to expand upon application of heat thereto so as to further arch in the second direction such that medial portions of said at least one compensating arched beam are spaced further apart from medial portions of said at least one arched beam;

a coupler which mechanically couples medial portions of the at least one arched beam and said at least one compensating arched beam at a point between the spaced apart supports; and means for applying heat to said at least one arched beam to cause further arching of the at least one arched beam as a result of thermal expansion thereof, to thereby cause displacement of the coupler along the predetermined direction.

20. A microelectromechanical structure according to claim 19 wherein the means for applying heat to at least one of the arched beams comprises means for passing current through at least one of the arched beams to cause further arching of the at least one of the beams as a result of thermal expansion thereof.

21. A microelectromechanical structure according to claim 19 wherein the means for applying heat to at least one of the arched beams comprises a heater which is external to the at least one of the arched beams, which heats the ambient surrounding the at least one of the arched beams and thereby heats the at least one of the arched beam.

22. A microelectromechanical structure according to claim 19 further comprising:

a first capacitor plate; and a second capacitor plate which is spaced apart from the first capacitor plate and which is mechanically coupled to the coupler, such that further displacement of the plurality of arched beams causes displacement of the second capacitor plate.

23. A microelectromechanical structure according to claim 22 wherein the means for applying heat comprises means for exposing at least one of the arched beams to a fluid flow, to thereby provide a capacitive flow sensor.

24. A microelectromechanical structure according to claim 19 further comprising:

at least one neutral beam which is not arched and which is mechanically coupled to the coupler.

25. A microelectromechanical structure according to claim 20 wherein the means for applying heat to at least one of the arched beams comprises means for passing current through alternating ones of the arched beams to cause further arching of the alternating ones of the beams as a result of direct heating, and to cause further arching of remaining ones of the arched beams by indirect heating from the alternating ones of the arched beams.

26. A microelectromechanical structure according to claim 20 wherein the at least one of the arched beams is fabricated of a conductive material having high resistivity.

27. A microelectromechanical structure according to claim 26 wherein the at least one of the arched beams is fabricated of nickel-phosphorous alloy.

28. A microelectromechanical structure comprising:

a microelectronic substrate;

spaced apart supports on the microelectronic substrate;

at least one arched beam which extends between the spaced apart supports, which is arched in a predetermined direction, and which expands upon application of heat thereto;

at least one neutral beam which is not arched and which extends between the spaced apart supports;

a coupler which mechanically couples the at least one arched beam and the at least one neutral beam; and means for applying heat to the at least one arched beam to cause further arching of the at least one arched beam as a result of thermal expansion thereof, to thereby cause displacement of the coupler along the predetermined direction.

29. A microelectromechanical structure according to claim 28 wherein said at least one arched beam and said at least one neutral beam extend between the same spaced apart supports.

* * * * *

UNITED STATES PATENT AND TRADEMARK OFFICE
CERTIFICATE OF CORRECTION

PATENT NO. : 5,909,078

DATED : June 1, 1999

INVENTOR(S) : Wood et al.

It is certified that error appears in the above-identified patent and that said Letters Patent is hereby corrected as shown below:

On the title page, item [56], in the References Cited,

U.S. PATENT DOCUMENTS, insert the following:

| | | |
|---|---|---|
| --3,609,593 | 09/1971 | Bell, et al. |
| 5,179,499 | 01/1993 | MacDonald, et al. |
| 5,261,747 | 11/1993 | Deacutis, et al. |
| 5,309,056 | 05/1994 | Culp |
| 5,367,584 | 11/1994 | Ghezzo, et al. |
| 5,467,068 | 11/1995 | Field, et al. |
| 5,483,799 | 01/1996 | Dalto |
| 5,536,988 | 07/1996 | Zhang, et al. |
| 5,644,177 | 07/1997 | Guckel, et al. |
| 5,722,989 | 03/1998 | Fitch, et al. |
| 5,796,152 | 08/1998 | Carr, et al. |
| 5,813,441 | 09/1998 | Dewispelaere |
| 5,862,003 | 01/1999 | Saif, et al.--. |

FOREIGN PATENT DOCUMENTS, insert the following:

| | | |
|---|---|---|
| --0478956 | 04/1992 | European Patent Office |
| 3809597 | 10/1989 | Germany |
| 0469749 | 02/1992 | European Patent Office |
| 0665590 | 08/1995 | European Patent Office--. |

UNITED STATES PATENT AND TRADEMARK OFFICE
CERTIFICATE OF CORRECTION

PATENT NO. : 5,909,078

DATED : June 1, 1999

INVENTOR(S) : Wood et al.

It is certified that error appears in the above-identified patent and that said Letters Patent is hereby corrected as shown below:

On the title page, item [56], in the References Cited,

OTHER PUBLICATIONS, insert the following:

--J.W. JUDY, T. TAMAGAWA and D.L. POLLA, *Surface Micromachined Linear Thermal Microactuator*, International Electron Devices Meeting 1990. Technical Digest (CAT. No. 90CH2865-4, December 1990, pp. 629-632, New York, New York.

E.H. KLAASSEN, ET AL: *Silicon Fusion Bonding And Deep Reactive Ion Etching: A New Technology For Microstructures*, Sensors And Actuators A, Vol. 52, No. 1/03, March 1996, pp. 132-139.

Gary K. FEDDER and Roger T. HOWE, *Multimode Digital Control of a Suspended Polysilicon Microstructure*, Journal of Microelectromechanical Systems, December 1996, pp. 283-297, Vol. 5, No. 4.

John H. COMTOIS and Victor M. BRIGHT, *Applications for surface-micromachined polysilicon thermal actuators and arrays*, Sensors and Actuators, January 1997, pp. 19-25, Vol. 58, No. 1.

Liwei LIN and Shiao-Hong LIN, *Vertically driven microactuators by electrothermal buckling effects*, Sensors and Actuators, November 1998, pp. 35-39, Vol. 71, No. 1-2.--.

UNITED STATES PATENT AND TRADEMARK OFFICE
CERTIFICATE OF CORRECTION

PATENT NO. : 5,909,078

DATED : June 1, 1999

INVENTOR(S) : Wood et al.

It is certified that error appears in the above-identified patent and that said Letters Patent is hereby corrected as shown below:

On the title page, item [56], in the References Cited, OTHER PUBLICATIONS, line 3, "Eurosensos" should read --Eurosensors--; line 12, "Sensor" should read --Sensors--; line 15, "2411" should read --3411--; page 2, col. 2, line 3, "a" should read --A--.

Signed and Sealed this

Second Day of November, 1999

Attest:

Q. TODD DICKINSON

*Attesting Officer*          *Acting Commissioner of Patents and Trademarks*